(12) United States Patent
Nentwig (10) Patent No.: US 10,554,187 B2
(45) Date of Patent: Feb. 4, 2020

(54) METHOD AND APPARATUS FOR SUPPLYING POWER TO AN AMPLIFIER

(71) Applicant: Provenance Asset Group LLC, Essex, CT (US)

(72) Inventor: Markus Nentwig, München (DE)

(73) Assignee: Provenance Asset Group LLC, Pittsford, NY (US)

( * ) Notice: Subject to any disclaimer, the term of this patent is extended or adjusted under 35 U.S.C. 154(b) by 201 days.

(21) Appl. No.: 15/558,337

(22) PCT Filed: Mar. 14, 2016

(86) PCT No.: PCT/FI2016/050155
§ 371 (c)(1),
(2) Date: Sep. 14, 2017

(87) PCT Pub. No.: WO2016/146888
PCT Pub. Date: Sep. 22, 2016

(65) Prior Publication Data
US 2018/0069516 A1  Mar. 8, 2018

(30) Foreign Application Priority Data

Mar. 17, 2015  (EP) .................................. 15159312

(51) Int. Cl.
*H03F 3/68* (2006.01)
*H03F 1/02* (2006.01)
(Continued)

(52) U.S. Cl.
CPC ............ *H03F 3/68* (2013.01); *H03F 1/0255* (2013.01); *H03F 1/0277* (2013.01); *H03F 3/195* (2013.01);
(Continued)

(58) Field of Classification Search
CPC combination set(s) only.
See application file for complete search history.

(56) References Cited

U.S. PATENT DOCUMENTS 7,170,341 B2 *  1/2007  Conrad .................... H03F 1/02
330/296
8,698,558 B2    4/2014  Mathe et al.
(Continued)

FOREIGN PATENT DOCUMENTS

EP          0673112 A1    9/1995
WO      2012/109161 A3    8/2012

OTHER PUBLICATIONS

Pengelly et al., "GaN Devices and AMO Technology Enable High Efficiency and Wide Bandwidth", Microwavejournal, Mar. 14, 2014, 11 pages.
(Continued)

*Primary Examiner* — Patricia T Nguyen
(74) *Attorney, Agent, or Firm* — Dinsmore & Shohl LLP (57) ABSTRACT

There are disclosed various methods and apparatuses for providing power to a set of power amplifiers. In some embodiments the method comprises obtaining first transmission parameters associated with a first transmit signal, selecting one or more output voltage values on the basis of the first transmission parameters, controlling a multi-level power source to generate one or more output voltages on the basis of the one or more output voltage values, multiplexing based on the first transmit signal between two or more of the output voltages and a first supply voltage terminal of a first power amplifier, and amplifying the first transmit signal with the first power amplifier.

15 Claims, 6 Drawing Sheets

(51) Int. Cl.
  *H03F 3/195* (2006.01)
  *H03F 3/24* (2006.01)
(52) U.S. Cl.
  CPC ......... *H03F 3/24* (2013.01); *H03F 2200/429* (2013.01); *H03F 2200/511* (2013.01); *H03F 2200/516* (2013.01)

(56) References Cited

U.S. PATENT DOCUMENTS

| | | | |
|---|---|---|---|
| 8,737,940 | B1 | 5/2014 | Langer et al. |
| 8,786,373 | B2 | 7/2014 | Presti et al. |
| 8,803,603 | B2 | 8/2014 | Wimpenny |
| 2007/0015472 | A1 | 1/2007 | Murtojarvi et al. |
| 2012/0075023 | A1 | 3/2012 | Guo |
| 2012/0146731 | A1* | 6/2012 | Khesbak ............... H03F 1/0222 330/295 |
| 2012/0200354 | A1 | 8/2012 | Ripley et al. |
| 2012/0293253 | A1* | 11/2012 | Khlat ................... H03F 1/0244 330/127 |
| 2013/0193943 | A1 | 8/2013 | Wilson |
| 2014/0002053 | A1* | 1/2014 | Wang .................... H02M 3/155 323/351 |
| 2014/0153461 | A1 | 6/2014 | Lorenz et al. |
| 2014/0167841 | A1* | 6/2014 | Henshaw .............. H03F 1/0227 330/124 R |
| 2014/0285261 | A1 | 9/2014 | Dakshinamurthy et al. |
| 2014/0335805 | A1* | 11/2014 | Briffa ................... H03G 3/3042 455/127.3 |
| 2015/0303961 | A1* | 10/2015 | Banerjee ................ H03F 3/211 375/287 |

OTHER PUBLICATIONS

"3rd Generation Partnership Project; Technical Specification Group Radio Access Network; Evolved Universal Terrestrial Radio Access (E-UTRA); Physical channels and modulation (Release 10)", 3GPP TS 36.211 V10.0.0, Dec. 2010, pp. 1-103.

Extended European Search Report received for corresponding European Patent Application No. 15159312.6, dated Jul. 8, 2015, 8 pages.

"Building Upon the Solid Foundation", Qualcomm, Retrieved on Sep. 7, 2017, Webpage available at : https://www.qualcomm.com/invention/technologies/hspa/hspa.

International Search Report and Written Opinion received for corresponding Patent Cooperation Treaty Application No. PCT/FI2016/050155, dated Jun. 17, 2016, 13 pages.

Office action received for corresponding European Patent Application No. 15159312.6, dated Sep. 5, 2017, 5 pages.

\* cited by examiner

METHOD AND APPARATUS FOR SUPPLYING POWER TO AN AMPLIFIER

RELATED APPLICATION

This application was originally filed as Patent Cooperation Treaty Application No. PCT/FI2016/050155filed Mar. 14, 2016 which claims priority benefit to European Patent Application No. 15159312.6, filed Mar. 17, 2015.

TECHNICAL FIELD

The present invention relates to a method for supplying power to an amplifier and an apparatus for supplying power to an amplifier.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Some apparatuses which are able to transmit and receive signals wirelessly may be battery powered and supply power to a radio frequency (RF) power amplifier (PA) of a transmitter from the battery. Such battery-operated wireless communication devices are, for example, mobile phones, personal digital assistants (PDA), etc. The power amplifier(s) may determine a large portion of the total power consumption of such devices. Batteries with low supply voltage, for example about 3 volts (V) or smaller than 3 V or higher than 3 V, for example 3.6 V or 3.7 V or 5 V, may be employed in the portable devices.

SUMMARY

Various embodiments provide a method and apparatus for supplying power to a power amplifier of a transmitter.

Various aspects of examples of the invention are provided in the detailed description.

According to a first aspect, there is provided a method comprising:

obtaining first transmission parameters associated with a first transmit signal;

selecting one or more output voltage values on the basis of the first transmission parameters;

controlling a multi-level power source to generate one or more output voltages on the basis of the one or more output voltage values;

multiplexing based on the first transmit signal between two or more of the output voltages and a first supply voltage terminal of a first power amplifier; and amplifying the first transmit signal with the first power amplifier.

According to a second aspect, there is provided an apparatus comprising:

a first element for obtaining first transmission parameters associated with a first transmit signal;

a second element for selecting output voltage values on the basis of the first transmission parameters;

a third element for controlling a multi-level power source to generate one or more output voltages on the basis of the one or more output voltage values; and a fourth element for multiplexing based on the first transmit signal between two or more of the output voltages and a first supply voltage terminal of a first power amplifier;

wherein the first power amplifier is adapted to amplify the first transmit signal.

According to a third aspect, there is provided an apparatus comprising at least one processor and at least one memory including computer program code, the at least one memory and the computer program code configured to, with the at least one processor, cause the apparatus to:

obtain first transmission parameters associated with a first transmit signal;

select one or more output voltage values on the basis of the first transmission parameters;

control a multi-level power source to generate one or more output voltages on the basis of the one or more output voltage values;

multiplex based on the first transmit signal between two or more of the output voltages and a first supply voltage terminal of a first power amplifier; and amplify the first transmit signal with the first power amplifier.

According to a fourth aspect, there is provided a computer program product including one or more sequences of one or more instructions which, when executed by one or more processors, cause an apparatus to at least perform the following:

obtain first transmission parameters associated with a first transmit signal;

select one or more output voltage values on the basis of the first transmission parameters;

control a multi-level power source to generate one or more output voltages on the basis of the one or more output voltage values;

multiplex based on the first transmit signal between two or more of the output voltages and a first supply voltage terminal of a first power amplifier; and amplify the first transmit signal with the first power amplifier.

According to a fifth aspect, there is provided an apparatus comprising:

means for obtaining first transmission parameters associated with a first transmit signal;

means for selecting one or more output voltage values on the basis of the first transmission parameters;

means for controlling a multi-level power source to generate one or more output voltages on the basis of the one or more output voltage values;

means for multiplexing based on the first transmit signal between two or more of the output voltages and a first supply voltage terminal of a first power amplifier; and means for amplifying the first transmit signal with the first power amplifier.

BRIEF DESCRIPTION OF THE DRAWINGS

For a more complete understanding of example embodiments of the present invention, reference is now made to the following descriptions taken in connection with the accompanying drawings in which.

DETAILED DESCRIPTON OF SOME EXAMPLE EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 1:
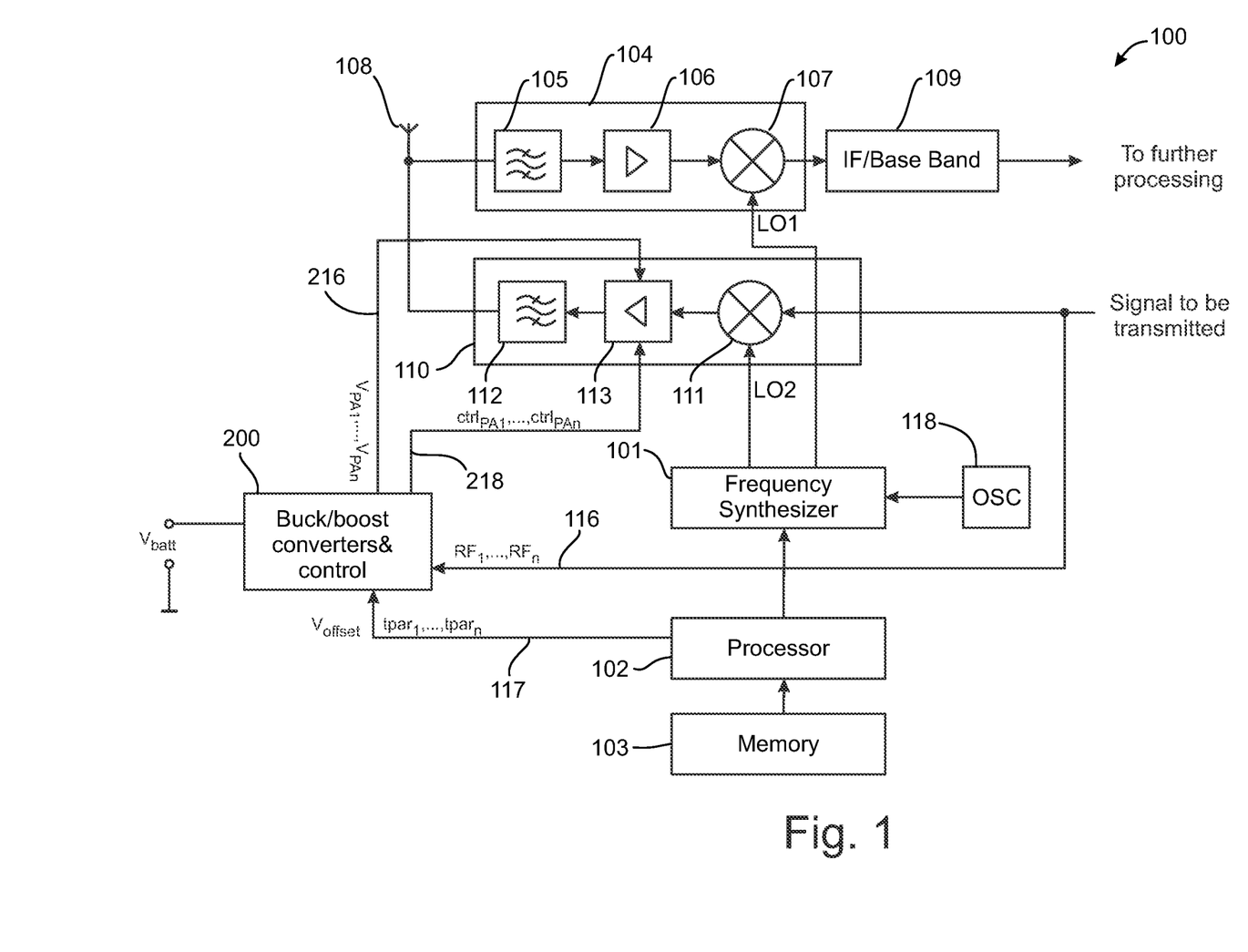
FIG. 1 shows a simplified block diagram of a device according to an example embodiment.

FIG. 1 depicts an example of a part of a device 100, which may be, for example, a mobile device such as a mobile phone, but may also be another device comprising the power amplifier 113. The device 100 may be constructed to include the frequency synthesizer 101 for generating one or more oscillator signals e.g. from a signal provided by a local oscillator 118. The device comprises one or more processors 102 for controlling the operation of the device, in accordance with an embodiment. The processor 102 operates in accordance with program instructions stored in at least one storage medium, such as at least one memory 103. The processor 102 may control the frequency synthesizer 101 for setting the output frequency/frequencies of the frequency synthesizer 101. These output frequencies form one or more local oscillator signals that may be applied simultaneously to an RF receiver circuitry 104. The RF receiver circuitry 104 may include one or multiple instances of filters 105, amplifiers 106 and mixers 107. The one or multiple instances of mixers 107 may be adapted to receive signals from the one or multiple instances of amplifiers 106 and a first local oscillator signal LO1. The RF receiver circuitry 104 may be configured to be connected with at least one, and possibly several antennas 108, and may operate to simultaneously receive and downconvert multiple reception channels in multiple frequency bands. The RF receiver circuitry 104 may be implemented e.g. as a single direct conversion receiver, as a plurality of direct conversion receivers, as a single superheterodyne-type receiver or as a plurality of superheterodyne-type receivers. In either case the downconverted signals from multiple reception channels are provided to at least one baseband circuitry block 109 to demodulate and decode received signaling and other data.

The device of FIG. 1 also comprises an RF transmitter 110 for transmitting radio frequency signals. The transmitter 110 may comprise one or more mixers 111 adapted to receive signals to be transmitted and a second local oscillator signal LO2. The mixing result may be provided to a power amplifier 113 to amplify the RF signals, and a band pass filter 112 to filter out mixing results which are out of the transmission band before passing them to one or more antennas 108. The mixing results which are passed through the band pass filter 112, in other words the wanted transmission signals, may be passed to the one or more antennas 108. The one or more antennas 108 may be the same one or more antennas than the RF receiver circuitry 104 uses or different antenna(s).

The RF receiver circuitry 104, the RF transmitter 110 and/or the baseband circuitry 109 may be embodied as an integrated circuit. In some embodiments the RF receiver circuitry 104, the RF transmitter 110 and the baseband circuitry 109 may be embodied in the same integrated circuit, and in some other embodiments they may be embodied in different integrated circuits. In some embodiments all of the circuitry shown in FIG. 1, including the processor 102 and possibly also the memory 103, may be embodied in one integrated circuit module or package.

In some embodiments all or some of the functionality of the frequency synthesizer 101 may be embodied by the processor 102 or by another processor, such as a high speed digital signal processor operating under control of a stored program.

The device 100 may comprise more than one RF receiver circuitry 104 and more than one RF transmitter 110 to enable simultaneous communication on multiple channels, multiple frequencies etc. In an embodiment the device 100 may further comprise more than one baseband circuitry 109.

Figure 2:
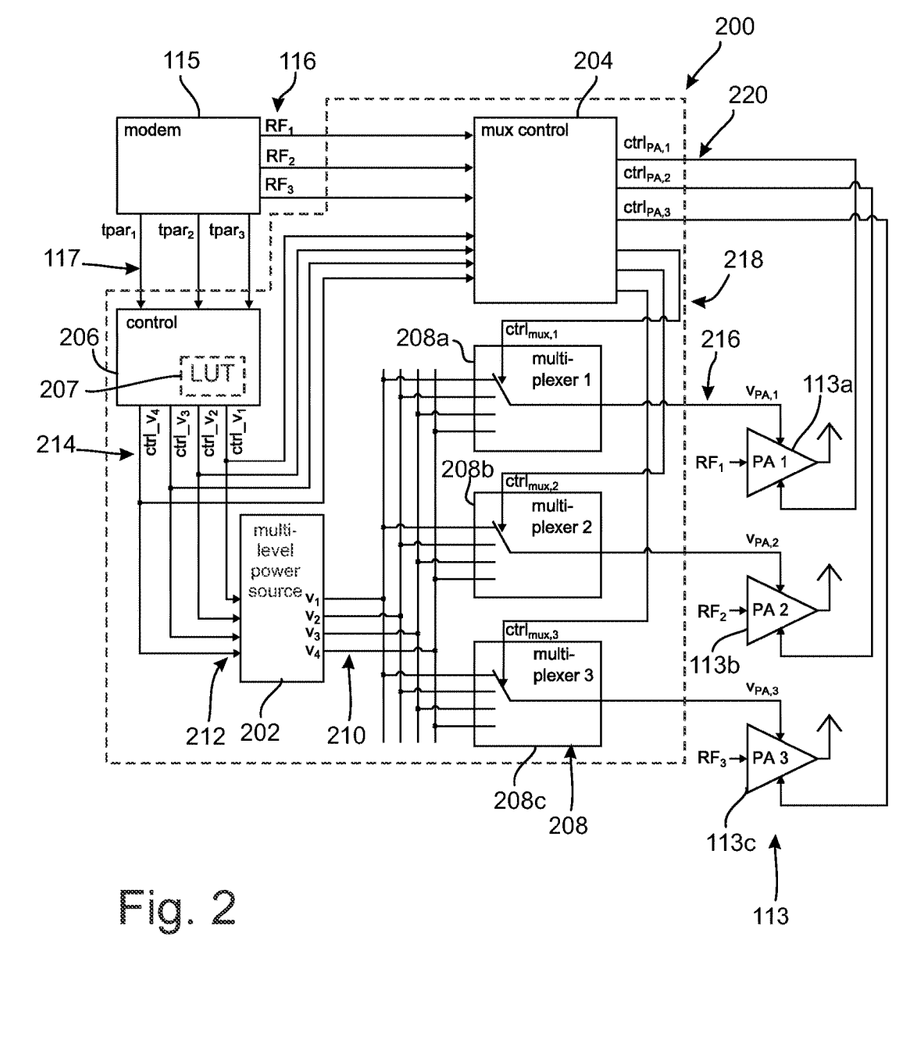
FIG. 2 illustrates an example of an apparatus for providing power to a set of power amplifiers, in accordance with an embodiment.

The device of FIG. 1 also comprises an apparatus 200 for supplying power to the power amplifier 113 of the transmitter 110 of the device 100. FIG. 2 depicts an example of the apparatus 200, in accordance with an embodiment. The apparatus 200 of FIG. 2 comprises a multi-level power source 202, a multiplexer control element 204, a control element 206 for controlling the multi-level power source 202 and the multiplexer control element 204, and a set of multiplexers 208 for providing power to the RF power amplifiers 113.

In accordance with an embodiment, there may be additional circuitry between the multiplexers 208 and the power amplifiers 113. For example, the output of the multiplexers 208 may be coupled to low-pass filters to filter out noise, peaks or other unwanted phenomena such as ripple from the voltage provided by the multiplexers 208. As another example, the output of the multiplexers 208 may be coupled to a controlled linear regulator.

In the following the operation of the apparatus 200 will be described in more detail. The device 100 may be communicating on one or more channels or modes wherein one or more modulating signals may be generated by the modem 115. The modulating signals 116 are provided to the multiplexer control element 204. In FIG. 2 these signals are also referred with labels RF1, RF2, RF3. Although three signals are depicted, the number of signals may be different from three. For example, only one or two signals may occur at a time, or more than three signals may also occur in some situations. The modulating signals may be, for example, digital base band signals, or analog signals, wherein an analog to digital conversion may be needed to provide the multiplexer control element 204 with the modulating signals in a digital form.

The modem 115 may also provide one or more transmission parameters 117 ($tpar_1, \ldots, tpar_n$) to the control element 206 which the control element 206 may use to determine voltage levels needed by the power amplifiers 113. If the RF transmitter 110 is operating multiple power amplifiers 113 simultaneously, each power amplifier 113 may transmit its own transmission signal. The transmission signal has known transmission parameters, such as an average power level, modulation, resource block allocation etc. The control element 206 may analyze one or more of the transmission parameters of each transmission signal to determine voltage level or voltage levels needed by the power amplifiers 113 to be able to generate appropriate transmission signals. The control element 206 may use, for example, a lookup table (LUT) 207 in the voltage level determination, or another appropriate way to find out the voltage level to be supplied for each power amplifier 113. The lookup table 207 is illustrated in FIG. 2 with a box within the control element 206 but in practical implementations the lookup table 207 may be constructed, for example, as a set of values in a memory addressable by input parameters. The lookup table may comprise as many dimensions as the number of transmission parameters which shall be used in the determination of the voltage level. Hence, the transmission parameters may be used as an index to the lookup table to find out the corresponding voltage level. It may, however, happen that the lookup table does not contain index values for the transmission parameters. Therefore, if a value of a transmission parameter is in between two values in the lookup table, an interpolation may be needed to find out the actual voltage level. In accordance with an embodiment, the so called Delaunay triangulation may be used to linearly interpolate a multi-dimensional lookup table.

On the basis of the determination the control element 206 selects a voltage level for a power amplifier selected to transmit the transmission signal.

The control element 206 may perform the voltage level determination for each active transmission signal using the signal's transmission parameters 117.

On the basis of the selected voltage levels the control element 206 controls the multi-level power source 202 to generate corresponding voltages.

The multi-level power source 202 comprises circuitry to generate multiple voltage outputs 210 having different voltage levels. For example, the multi-level power source 202 may comprise four voltage outputs $V_1$, $V_2$, $V_3$ and $V_4$, but may have less than four or more than four voltage outputs. In accordance with an embodiment, the multi-level power source 202 also comprises a control input 212 for each voltage output, or the multi-level power source 202 may comprise a common control input for each voltage output.

In accordance with an embodiment, the multi-level power source 202 may comprise circuitry for forming output voltages which are higher than a battery voltage and/or circuitry which may be able to output voltages which are smaller than the battery voltage. The circuitry capable of providing voltages above the battery voltage may be called as boost converters and circuitry capable of providing voltages below the battery voltage may be called as buck converters. Also other types of voltage converter circuitry may be utilized by the multi-level power source 202 such as a voltage regulator which may convert an input voltage to a lower level output voltage.

In the embodiment of the example of FIG. 2, the control inputs 212 of the multi-level power source 202 are coupled to the control outputs 214 of the control element 206. Hence, a first control output may provide a first control signal ctrl_$V_1$ to a first voltage control input of the multi-level power source 202, a second control output may provide a second control signal ctrl_$V_2$ to a second voltage control input of the multi-level power source 202, a third control output may provide a third control signal ctrl_$V_3$ to a third voltage control input of the multi-level power source 202, and a fourth control output may provide a fourth control signal ctrl_$V_4$ to a fourth voltage control input of the multi-level power source 202. For example, the first control output ctrl_$V_1$ may provide a control signal to the multi-level power source 202 to output a first voltage value $V_1$ at the first output and the third control output ctrl_$V_3$ may provide a control signal to the multi-level power source 202 to output a third voltage value $V_3$ at the third output. In other words, the control outputs ctrl_$V_1$, ctrl_$V_2$, ctrl_$V_3$, ctrl_$V_4$, may indicate the multi-level power source 202 which voltage levels need to be generated by the multi-level power source 202.

The control outputs 214 of the control element 206 may also be connected to the multiplexer control element 204 to provide the multiplexer control element 204 information on the voltage outputs which the multi-level power source 202 is controlled to generate. The multiplexer control element 204 also examines the signal levels of each transmission signal $RF_1$, ..., $RF_n$ and uses this information to determine the voltage levels to be supplied to the corresponding power amplifiers 113. For example, if the multiplexer control element 204 determines that the first power amplifier 113a needs the voltage level provided by the first voltage output $V_1$, the multiplexer control element 204 may provide the first multiplexer 208a a selection signal 218 (ctrl$_{mux1}$) which induces the first multiplexer 208a to connect the first voltage output $V_1$ from the multi-level power source 202 to the output of the first multiplexer 208a. Hence, the first power amplifier 113a is supplied the first voltage $V_1$. In a situation in which the multiplexer control element 204 determines that the voltage level provided by the second voltage output $V_2$ would be sufficient for the first power amplifier 113a, the multiplexer control element 204 may provide the first multiplexer 208a a selection signal which induces the first multiplexer 208a to connect the second voltage output $V_2$ from the multi-level power source 202 to the output of the first multiplexer 208a. In other words, the multiplexer control element 204 may control each multiplexer 208 so that the supply voltages 216 for each power amplifier 113 are sufficient for the power amplifiers to substantially accurately amplify the corresponding RF transmission signals.

Figure 3:
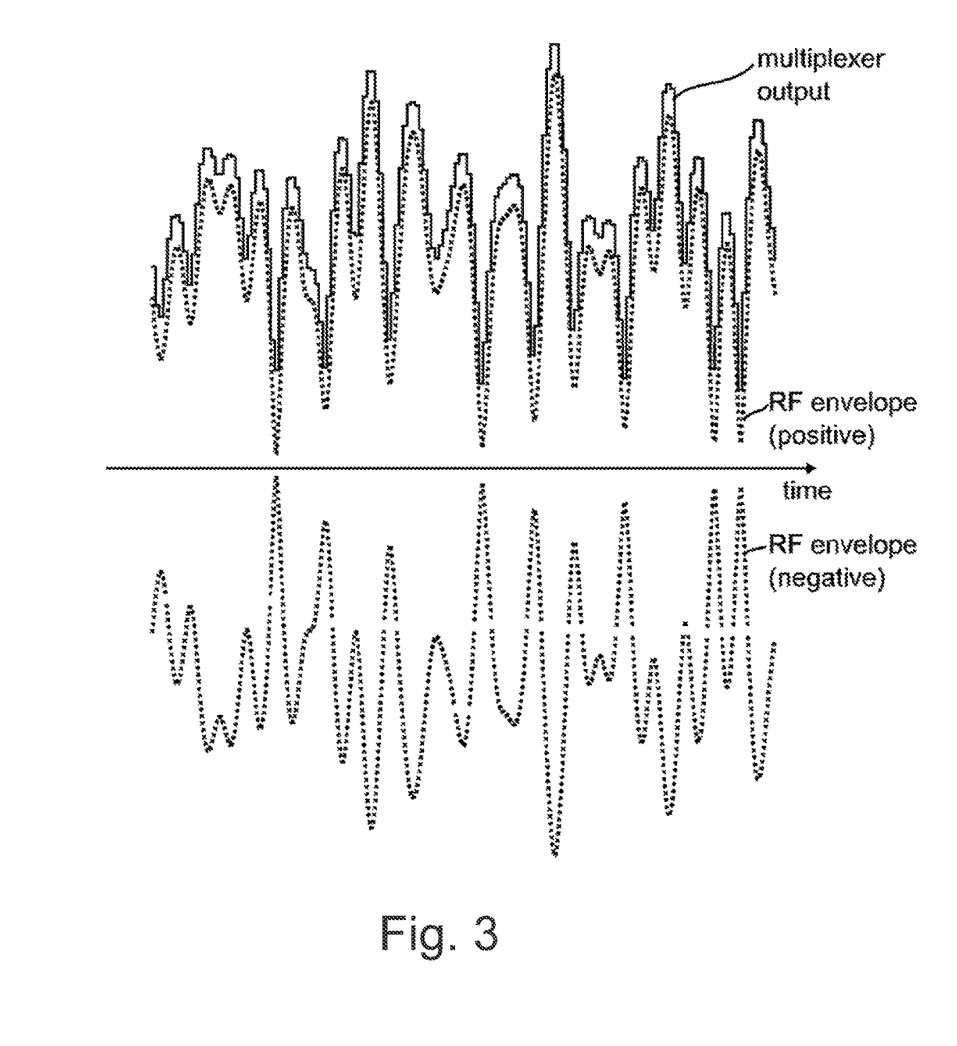
FIG. 3 illustrates some signal waveforms in connection with the apparatus, in accordance with an embodiment.

FIG. 3 illustrates an example of a multiplexer output with reference to a transmission signal. It can be seen that the multiplexer output voltage follows the positive envelope of the RF transmission signal so that the multiplexer output voltage is the same or higher than the positive envelope of the RF transmission signal.

If the voltage generation circuitries of the multi-level power source 202 provide constant output voltages, the voltage supplied to the power amplifier 113 may follow the envelope of the transmission signal in a step-wise manner and the number of available voltage levels may affect to the accuracy the supply voltage is able to follow the envelope of the transmission signal. The more there are different voltage levels the more accurately the voltage supplied to the power amplifier may follow the envelope. In the example of FIG. 3 there are quite many different voltage levels available, wherein the voltage supplied to the power amplifier can be quite close to the envelope of the transmission signal.

In accordance with an embodiment, in some situations one voltage outputs may be reserved only to a certain power amplifier, wherein that voltage output should not be used by the other power amplifiers. A reason for this may be to reduce the amount of noise on that specific voltage output, caused for example by multiplexing or time-varying loading of the voltage output by a power amplifier. In this kind of situations the multiplexer control element 204 avoids that voltage output when controlling the multiplexers of other power amplifiers. If it occurs that one or more of the other power amplifiers 113 should be supplied with that particular voltage level, which is reserved only for another power amplifier, the multiplexer control element 204 may select a voltage output having a next higher voltage level, if available, instead of the desired voltage level. Usually it may not harm if the power amplifiers are supplied higher voltage level than the optimum voltage level, but the power consumption may then not be optimum.

In accordance with an embodiment, a power amplifier 113 may be configured to operate in a low-power mode (e.g. by bypassing a final stage of the power amplifier), wherein that power amplifier 113 may be supplied with a constant DC voltage.

The multiplexer control element 204 may also comprise control outputs 220 ($ctrl_{PA1}$, $ctrl_{PA2}$, $ctrl_{PA3}$) for the power amplifiers 113 to control the operation states of the power amplifiers 113. Hence, if the lookup table is used, the lookup table may also need an output parameter for the operation mode, or the operation mode may be determined by using another appropriate method. For example, the transmission parameters may reveal that one power amplifier 113 should operate with a constant supply voltage (e.g. an average power tracking mode, APT) while other power amplifiers 113 may use time-varying supply voltage. The usage of the constant supply voltage may be due to more stringent noise requirements for that power amplifier. Such stringent noise requirements may appear because of duplex spacing, band-specific requirements, network-signaled values, etc.

In the average power tracking mode the corresponding circuitry of the multi-level power source 202 which produces the voltage for the power amplifier 113 operating in the APT mode may dynamically change the power amplifier supply voltage based on the power amplifier's average output power. When the output power of the power amplifier is less than a maximum, the supply voltage may be reduced. Adjustments in the power amplifier supply voltage may occur when the average output power changes.

Figures 4A, 4B:
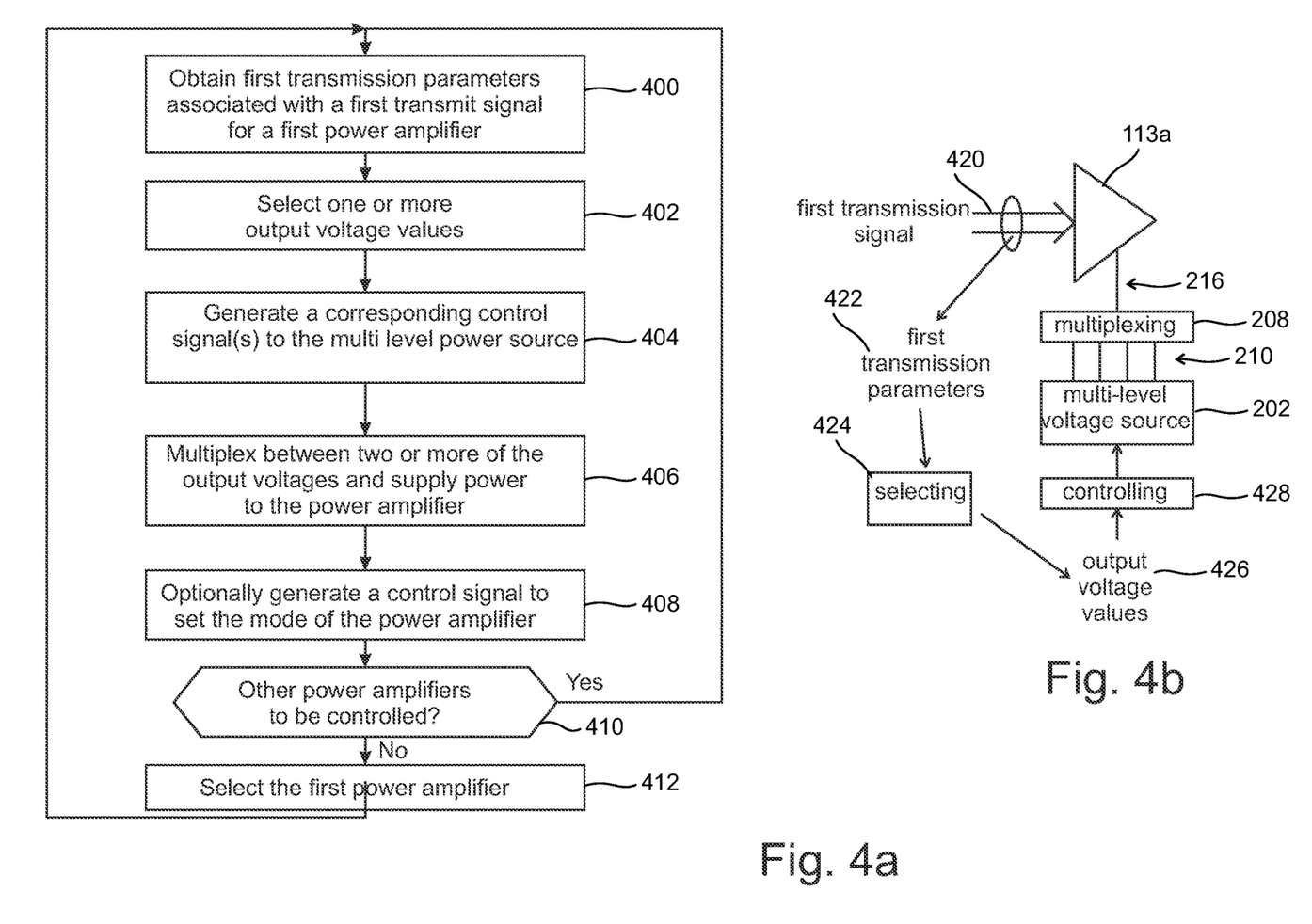
FIG. 4a depicts as a flow diagram an example embodiment of the operation of the apparatus.
FIG. 4b depicts another diagram of the operation of the apparatus, in accordance with an embodiment.

FIG. 4a depicts as a flow diagram an example embodiment of the operation of the apparatus 200. First transmission parameters associated with a first transmit signal for a first power amplifier 113a are obtained in block 400. The first transmission parameters may be used to select 402 one or more output voltages which may be needed for the first power amplifier 113a. The multi-level power source 202 is controlled 404 so that it would generate the one or more voltages selected in step 402. A multiplexer 208 may be controlled 406 so that it multiplexes between two or more of the voltages and supplies power to the first power amplifier 113a, wherein the first power amplifier 113a may amplify the first transmit signal. Optionally, another control signal may be provided 408 to the power amplifier 113 to set the mode of the power amplifier. The above mentioned operations may be repeated 410 to other power amplifiers 113 as well. When the operations are performed for all power amplifiers 113, the procedure may continue 412 from the beginning In other words, these operations may be continuous i.e. repeated again and again during the operation of the device 100.

In accordance with an embodiment, the level of the transmission signal to be amplified by that power amplifier 113 is measured to determine 404 the voltage level or voltage levels needed to be supplied to the power amplifier 113.

FIG. 4b depicts a diagram of the operation of the apparatus 200 according to an example embodiment, when controlling the supply voltage to be provided to a first power amplifier 113a. First transmission signals are provided 420 to the first power amplifier 113a. First transmission parameters associated with the first transmission signal are obtained 422. The (first) transmission parameters may be used to select 424 one or more output voltage values 426. These output voltage values 426 may be used in controlling 428 the multi-level power source 202. The multi-level power source 202 generates one or more output voltages 210 to be provided to the multiplexer 208, which may perform multiplexing between these output voltages and provide the output voltage 216 to the first power amplifier 113a which provides the voltage level needed by the first power amplifier 113a. During operation of the apparatus the provided output voltage 216 may vary. It should be noted that although the terms first power amplifier 113a and first transmission signal were used here, similar operation may be applied to the other power amplifiers of the device 100 as well using transmission signals relating to the other power amplifiers.

In accordance with another embodiment, the selection of the voltage level for one power amplifier 113 may also be dependent on the operation mode or other criteria of one or more other power amplifiers. One example was already mentioned above, namely if one (or more) power amplifier 113 is set to operate in a constant supply voltage mode, it may be required that the reserved voltage output may not be used by the other power amplifiers 113.

In LTE based systems downlink and uplink transmissions are organized into frames of certain duration (10 ms). According to the standard 3GPP TS 36.211 version 10.0.0 release 10, frames are divided into ten subframes, which may further be divided into two slots of 0.5 ms. A resource block is the smallest unit of resources that can be allocated to a user. In time domain a resource block is one slot long. The bandwidth of the resource block is 180 kHz. In frequency, resource blocks are composed of either 12×15 kHz subcarriers or 24×7.5 kHz subcarriers.

The following describes in further detail suitable apparatus and possible mechanisms for implementing the embodiments of the invention. In this regard reference is first made to FIG. 5 which shows a schematic block diagram of an exemplary apparatus or electronic device 50 depicted in FIG. 6, which may incorporate a transmitter according to an embodiment of the invention.

The electronic device 50 may for example be a mobile terminal or user equipment of a wireless communication system. However, it would be appreciated that embodiments of the invention may be implemented within any electronic device or apparatus which may require transmission of radio frequency signals.

Figure 5:
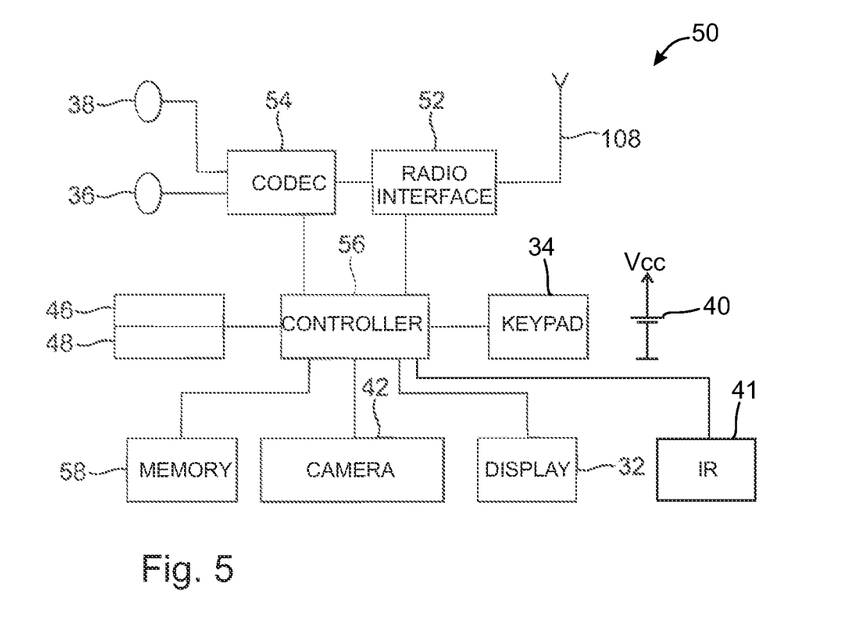
FIG. 5 shows a block diagram of an apparatus according to an example embodiment.
Figure 6:
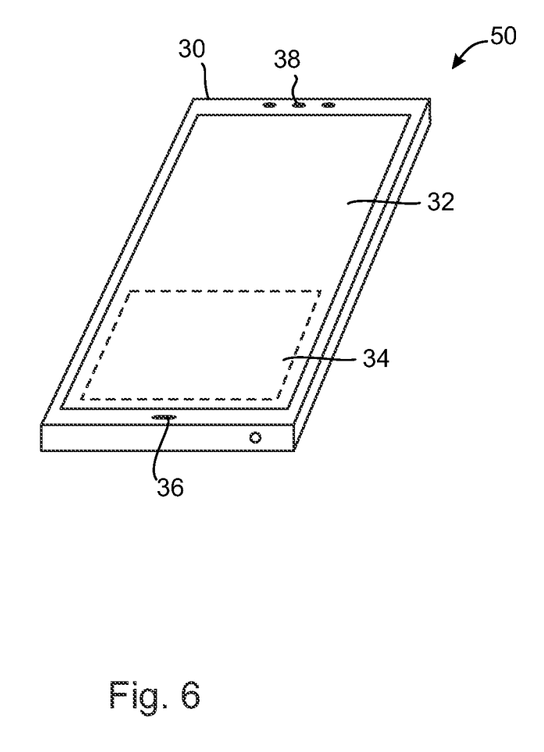
FIG. 6 shows an apparatus according to an example embodiment.

The apparatus 50 may comprise a housing 30 for incorporating and protecting the device. The apparatus 50 further may comprise a display 32 in the form of a liquid crystal display. In other embodiments of the invention the display may be any suitable display technology suitable to display an image or video. The apparatus 50 may further comprise a keypad 34. In other embodiments of the invention any suitable data or user interface mechanism may be employed. For example the user interface may be implemented as a virtual keyboard or data entry system as part of a touch-sensitive display. The apparatus may comprise a microphone 36 or any suitable audio input which may be a digital or analogue signal input. The apparatus 50 may further comprise an audio output device which in embodiments of the invention may be any one of: an earpiece 38, speaker, or an analogue audio or digital audio output connection. The apparatus 50 may also comprise a battery 40 (or in other embodiments of the invention the device may be powered by any suitable mobile energy device such as solar cell, fuel cell or clockwork generator). The term battery discussed in connection with the embodiments may also be one of these mobile energy devices. Further, the apparatus 50 may comprise a combination of different kinds of energy devices, for example a rechargeable battery and a solar cell. The apparatus may further comprise an infrared port 41 for short range line of sight communication to other devices. In other embodiments the apparatus 50 may further comprise any suitable short range communication solution such as for example a Bluetooth wireless connection or a USB/firewire wired connection.

The apparatus 50 may comprise a controller 56 or processor for controlling the apparatus 50. The controller 56 may be connected to memory 58 which in embodiments of the invention may store both data and/or may also store instructions for implementation on the controller 56. The controller 56 may further be connected to codec circuitry 54 suitable for carrying out coding and decoding of audio and/or video data or assisting in coding and decoding carried out by the controller 56.

The apparatus 50 may further comprise a card reader 48 and a smart card 46, for example a universal integrated circuit card (UICC) reader and UICC for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system or a wireless local area network. The apparatus 50 may further comprise an antenna 108 connected to the radio interface circuitry 52 for transmitting radio frequency signals generated at the radio interface circuitry 52 to other apparatus(es) and for receiving radio frequency signals from other apparatus(es).

In some embodiments of the invention, the apparatus 50 comprises a camera 42 capable of recording or detecting imaging.

Figure 7:
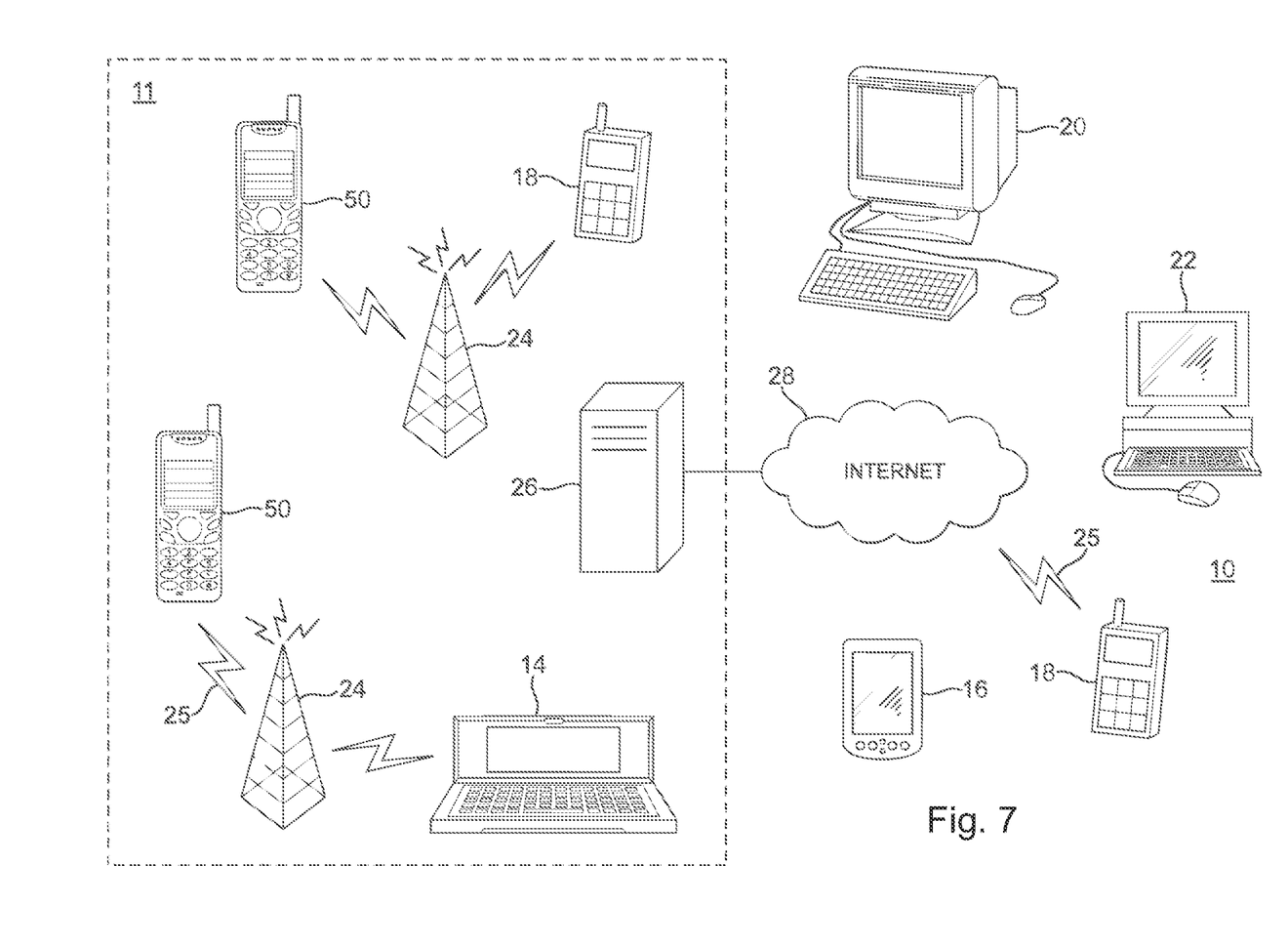
FIG. 7 shows an example of an arrangement for wireless communication comprising a plurality of apparatuses, networks and network elements.

With respect to FIG. 7, an example of a system within which embodiments of the present invention can be utilized is shown. The system 10 comprises multiple communication devices which can communicate through one or more networks. The system 10 may comprise any combination of wired and/or wireless networks including, but not limited to a wireless cellular telephone network (such as a GSM, UMTS, CDMA network etc.), a wireless local area network (WLAN) such as defined by any of the IEEE 802.x standards, a Bluetooth personal area network, an Ethernet local area network, a token ring local area network, a wide area network, and the Internet.

For example, the system shown in FIG. 7 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a notebook computer 22, a tablet computer. The apparatus 50 may be stationary or mobile when carried by an individual who is moving. The apparatus 50 may also be located in a mode of transport including, but not limited to, a car, a truck, a taxi, a bus, a train, a boat, an airplane, a bicycle, a motorcycle or any similar suitable mode of transport.

Some or further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11, Long Term Evolution wireless communication technique (LTE) and any similar wireless communication technology. Yet some other possible transmission technologies to be mentioned here are high-speed downlink packet access (HSDPA), high-speed uplink packet access (HSUPA), LTE Advanced (LTE-A) carrier aggregation dual- carrier, and all multi-carrier technologies. A communications device involved in implementing various embodiments of the present invention may communicate using various media including, but not limited to, radio, infrared, laser, cable connections, and any suitable connection. In the following some example implementations of apparatuses utilizing the present invention will be described in more detail.

Although the above examples describe embodiments of the invention operating within a wireless communication device, it would be appreciated that the invention as described above may be implemented as a part of any apparatus comprising a circuitry in which radio frequency signals are transmitted and/or received. Thus, for example, embodiments of the invention may be implemented in a mobile phone, in a base station, in a computer such as a desktop computer or a tablet computer comprising radio frequency communication means (e.g. wireless local area network, cellular radio, etc.).

In general, the various embodiments of the invention may be implemented in hardware or special purpose circuits or any combination thereof While various aspects of the invention may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules, field-programmable gate arrays (FPGA), application specific integrated circuits (ASIC), microcontrollers, microprocessors, a combination of such modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

In the following some examples will be provided.

According to a first example, there is provided a method comprising:

obtaining first transmission parameters associated with a first transmit signal;

selecting one or more output voltage values on the basis of the first transmission parameters;

controlling a multi-level power source to generate one or more output voltages on the basis of the one or more output voltage values;

multiplexing based on the first transmit signal between two or more of the output voltages and a first supply voltage terminal of a first power amplifier; and amplifying the first transmit signal with the first power amplifier.

In some embodiments the method comprises:

obtaining second transmit parameters associated with a second transmit signal;

selecting one or more output voltage values on the basis of the second transmission parameters; and providing power from at least one of the output voltages to a second supply voltage terminal of a second power amplifier.

In some embodiments of the method providing power comprises:

multiplexing based on the second transmit signal between two or more of the output voltages and a second supply voltage terminal of the second power amplifier.

In some embodiments the output voltages comprise a first output voltage, wherein the method comprises:

providing power from the first output voltage to the second supply voltage terminal of the second power amplifier; and multiplexing excludes providing power from the first output voltage to the first supply voltage terminal.

In some embodiments the method comprises:

looking up one or more output voltage values from a lookup table on the basis of the first transmission parameters.

According to a second example, there is provided an apparatus comprising:

a first element for obtaining first transmission parameters associated with a first transmit signal;

a second element for selecting output voltage values on the basis of the first transmission parameters;

a third element for controlling a multi-level power source to generate one or more output voltages on the basis of the one or more output voltage values; and a fourth element for multiplexing based on the first transmit signal between two or more of the output voltages and a first supply voltage terminal of a first power amplifier;

wherein the first power amplifier is adapted to amplify the first transmit signal.

In some embodiments the apparatus is adapted to:

obtaining second transmit parameters associated with a second transmit signal;

selecting one or more output voltage values on the basis of the second transmission parameters; and providing power from at least one of the output voltages to a second supply voltage terminal of a second power amplifier.

In some embodiments the apparatus is adapted to:

multiplex based on the second transmit signal between two or more of the output voltages and a second supply voltage terminal of the second power amplifier.

In some embodiments the output voltages comprise a first output voltage, wherein the apparatus is adapted to:

provide power from the first output voltage to the second supply voltage terminal of the second power amplifier; and exclude providing power from the first output voltage to the first supply voltage terminal.

In some embodiments the apparatus is adapted to look up one or more output voltage values from a lookup table on the basis of the first transmission parameters.

In some embodiments the apparatus is a part of a wireless communication device.

According to a third example, there is provided an apparatus comprising at least one processor and at least one memory including computer program code, the at least one memory and the computer program code configured to, with the at least one processor, cause the apparatus to:

obtain first transmission parameters associated with a first transmit signal;

select one or more output voltage values on the basis of the first transmission parameters;

control a multi-level power source to generate one or more output voltages on the basis of the one or more output voltage values;

multiplex based on the first transmit signal between two or more of the output voltages and a first supply voltage terminal of a first power amplifier; and amplify the first transmit signal with the first power amplifier.

In some embodiments of the apparatus said at least one memory including computer program code, the at least one memory and the computer program code configured to, with the at least one processor, cause the apparatus to:

obtain second transmit parameters associated with a second transmit signal;

select one or more output voltage values on the basis of the second transmission parameters; and provide power from at least one of the output voltages to a second supply voltage terminal of a second power amplifier.

In some embodiments of the apparatus said at least one memory including computer program code, the at least one memory and the computer program code configured to, with the at least one processor, cause the apparatus to:

multiplex based on the second transmit signal between two or more of the output voltages and a second supply voltage terminal of the second power amplifier.

In some embodiments of the apparatus the output voltages comprise a first output voltage, wherein said at least one memory including computer program code, the at least one memory and the computer program code configured to, with the at least one processor, cause the apparatus to:

provide power from the first output voltage to the second supply voltage terminal of the second power amplifier; and exclude providing power from the first output voltage to the first supply voltage terminal.

In some embodiments of the apparatus said at least one memory including computer program code, the at least one memory and the computer program code configured to, with the at least one processor, cause the apparatus to:

look up one or more output voltage values from a lookup table on the basis of the first transmission parameters.

According to a fourth example, there is provided a computer program product including one or more sequences of one or more instructions which, when executed by one or more processors, cause an apparatus to at least perform the following:

obtain first transmission parameters associated with a first transmit signal;

select one or more output voltage values on the basis of the first transmission parameters;

control a multi-level power source to generate one or more output voltages on the basis of the one or more output voltage values;

multiplex based on the first transmit signal between two or more of the output voltages and a first supply voltage terminal of a first power amplifier; and amplify the first transmit signal with the first power amplifier.

According to a fifth example, there is provided an apparatus comprising:

means for obtaining first transmission parameters associated with a first transmit signal;

means for selecting one or more output voltage values on the basis of the first transmission parameters;

means for controlling a multi-level power source to generate one or more output voltages on the basis of the one or more output voltage values;

means for multiplexing based on the first transmit signal between two or more of the output voltages and a first supply voltage terminal of a first power amplifier; and means for amplifying the first transmit signal with the first power amplifier.

The invention claimed is:

1. A method comprising:
   obtaining, via a control element, first transmission parameters associated with a first transmit signal;
   selecting, via the control element, one or more output voltage values on the basis of the first transmission parameters;
   controlling, via the control element, a multi-level power source to generate through the multi-level power source one or more output voltages on the basis of the one or more output voltage values;
   multiplexing through a multiplexer control element a first multiplexer of a plurality of multiplexers configured for simultaneous control by the multiplexer control element based on
   (i) the first transmit signal to select a selection voltage based on a selection signal from the multiplexer control element for the first multiplexer, wherein the selection voltage is selected between two or more of the output voltages; and
   (ii) a first supply voltage terminal of a first power amplifier of a plurality of power amplifiers, the first power amplifier determined by the multiplexer control element to require the selection voltage for amplification of the first transmit signal; and
   amplifying the first transmit signal with the first power amplifier based on the selection voltage to optimize power consumption.

2. The method according to claim 1 comprising:
   obtaining second transmit parameters associated with a second transmit signal;
   selecting one or more output voltage values on the basis of the second transmission parameters; and
   providing power from at least one of the output voltages to a second supply voltage terminal of a second power amplifier.

3. The method according to claim 2, where providing power comprises:
   multiplexing based on the second transmit signal between two or more of the output voltages and a second supply voltage terminal of the second power amplifier.

4. The method according to claim 2, where the output voltages comprise a first output voltage, wherein the method comprises:
   providing power from the first output voltage to the second supply voltage terminal of the second power amplifier; and
   multiplexing excludes providing power from the first output voltage to the first supply voltage terminal.

5. The method according to claim 1 comprising:
   looking up one or more output voltage values from a lookup table on the basis of the first transmission parameters.

6. A computer program product including one or more sequences of one or more instructions which, when executed by one or more processors, cause an apparatus to at least perform the following:
   obtain, via a control element, first transmission parameters associated with a first transmit signal;
   select, via the control element, one or more output voltage values on the basis of the first transmission parameters;
   control, via the control element, a multi-level power source to generate through the multi-level power source one or more output voltages on the basis of the one or more output voltage values;
   multiplex through a multiplexer control element a first multiplexer of a plurality of multiplexers configured for simultaneous control by the multiplexer control element based on
   (i) the first transmit signal to select a selection voltage based on a selection signal from the multiplexer control element for the first multiplexer, wherein the selection voltage is selected between two or more of the output voltages and
   (ii) a first supply voltage terminal of a first power amplifier of a plurality of power amplifiers, the first power amplifier determined by the multiplexer control element to require the selection voltage for amplification of the first transmit signal; and
   amplify the first transmit signal with the first power amplifier based on the selection voltage to optimize power consumption.

7. The computer program product according to claim 6, the computer program product including one or more sequences of one or more instructions which, when executed by one or more processors, cause the apparatus to:
   obtain second transmit parameters associated with a second transmit signal;
   select one or more output voltage values on the basis of the second transmission parameters; and
   provide power from at least one of the output voltages to a second supply voltage terminal of a second power amplifier.

8. The computer program product according to claim 7, the computer program product including one or more sequences of one or more instructions which, when executed by one or more processors, cause the apparatus to:

multiplex based on the second transmit signal between two or more of the output voltages and a second supply voltage terminal of the second power amplifier.

9. The computer program product according to claim 7, the computer program product including one or more sequences of one or more instructions which, when executed by one or more processors, cause the apparatus to:

provide power from the first output voltage to the second supply voltage terminal of the second power amplifier; and exclude providing power from the first output voltage to the first supply voltage terminal.

10. The computer program product according to claim 6, the computer program product including one or more sequences of one or more instructions which, when executed by one or more processors, cause the apparatus to:

look up one or more output voltage values from a lookup table on the basis of the first transmission parameters.

11. An apparatus comprising at least one processor and at least one memory including computer program code, the at least one memory and the computer program code configured to, with the at least one processor, cause the apparatus to:

obtain, via a control element, first transmission parameters associated with a first transmit signal;

select, via the control element, one or more output voltage values on the basis of the first transmission parameters;

control, via the control element, a multi-level power source to generate through the multi-level power source one or more output voltages on the basis of the one or more output voltage values;

multiplex through a multiplexer control element a first multiplexer of a plurality of multiplexers configured for simultaneous control by the multiplexer control element based on (i) the first transmit signal to select a selection voltage based on a selection signal from the multiplexer control element for the first multiplexer, wherein the selection voltage is selected between two or more of the output voltages and (ii) a first supply voltage terminal of a first power amplifier of a plurality of power amplifiers, the first power amplifier determined by the multiplexer control element to require the selection voltage for amplification of the first transmit signal; and amplify the first transmit signal with the first power amplifier based on the selection voltage to optimize power consumption.

12. The apparatus according to claim 11 said at least one memory including computer program code, the at least one memory and the computer program code configured to, with the at least one processor, cause the apparatus to:

multiplex based on the second transmit signal between two or more of the output voltages and a second supply voltage terminal of the second power amplifier.

13. The apparatus according to claim 12 said at least one memory including computer program code, the at least one memory and the computer program code configured to, with the at least one processor, cause the apparatus to:

obtain second transmit parameters associated with a second transmit signal;

select one or more output voltage values on the basis of the second transmission parameters; and provide power from at least one of the output voltages to a second supply voltage terminal of a second power amplifier.

14. The apparatus according to claim 12, the output voltages comprising a first output voltage, wherein said at least one memory including computer program code, the at least one memory and the computer program code configured to, with the at least one processor, cause the apparatus to:

provide power from the first output voltage to the second supply voltage terminal of the second power amplifier; and exclude providing power from the first output voltage to the first supply voltage terminal.

15. The apparatus according to claim 11, wherein it is a part of a wireless communication device.

* * * * *